United States Patent
Jung et al.

(10) Patent No.: US 10,068,923 B2
(45) Date of Patent: Sep. 4, 2018

(54) TRANSPARENT DISPLAY DEVICE AND METHOD OF MANUFACTURING THE SAME

(71) Applicant: Samsung Display Co., Ltd., Yongin-Si, Gyeonggi-Do (KR)

(72) Inventors: Seung-Ho Jung, Hwaseong-si (KR); Chaun-Gi Choi, Suwon-si (KR); Hyeon-Sik Kim, Yongin-si (KR); Hye-Young Park, Seongnam-si (KR); Hye-Hyang Park, Yongin-si (KR); Hui-Won Yang, Seoul (KR); Eun-Young Lee, Seoul (KR); Joo-Hee Jeon, Anyang-si (KR); Su-Kyoung Yang, Yongin-si (KR); Chan-Woo Yang, Siheung-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 68 days.

(21) Appl. No.: 15/190,919

(22) Filed: Jun. 23, 2016

(65) Prior Publication Data

US 2017/0084635 A1    Mar. 23, 2017

(30) Foreign Application Priority Data

Sep. 17, 2015  (KR) .................. 10-2015-0131835

(51) Int. Cl.
*H01L 27/12*     (2006.01)
*H01L 29/786*    (2006.01)
*H01L 27/32*     (2006.01)

(52) U.S. Cl.
CPC ........ *H01L 27/1218* (2013.01); *H01L 27/124* (2013.01); *H01L 27/1222* (2013.01);

(Continued)

(58) Field of Classification Search
None
See application file for complete search history.

(56) References Cited

U.S. PATENT DOCUMENTS 8,658,448 B2 *  2/2014  Kuwabara .......... H01L 27/1225
                                                      438/158
8,766,253 B2 *  7/2014  Miyake .............. H01L 27/1225
                                                      257/43

(Continued)

FOREIGN PATENT DOCUMENTS

KR   1020140081487 A   7/2014
KR   1020150037702 A   4/2015
KR   1020160053001 A   5/2016

OTHER PUBLICATIONS

J. W. Elam, et al., Improved nucleation of TiN atomic layer deposition films on Silk low-k polymer dielectric using an Al2O3 atomic layer deposition adhesion layer, Journal of Vacuum Science & Technology B, 21(3), May/Jun. 2003, pp. 1099-1107.

*Primary Examiner* — Michael Lebentritt
(74) *Attorney, Agent, or Firm* — Cantor Colburn LLP

(57) ABSTRACT

A transparent display device includes a base substrate having a pixel area and a transmission area, a barrier layer disposed on the base substrate, a pixel circuit disposed in the pixel area, a display structure disposed on the pixel circuit, a transmitting structure disposed in the transmission area, an adhesive layer disposed between the base substrate and the barrier layer, and between the base substrate and the transmitting structure, and a transmitting window defined in the transmission area where the transmitting structure may include a composition including silicon oxynitride, the adhesive layer may include aluminum oxide, and the transmitting window may expose a surface of the transmitting structure.

20 Claims, 10 Drawing Sheets

(52) U.S. Cl.
CPC ...... *H01L 27/1266* (2013.01); *H01L 27/1285* (2013.01); *H01L 29/78675* (2013.01); *H01L 27/3262* (2013.01); *H01L 2227/323* (2013.01)

(56) References Cited

U.S. PATENT DOCUMENTS

| | | | | |
|---|---|---|---|---|
| 8,946,702 B2* | 2/2015 | Yamazaki | ........... | H01L 29/7831 257/347 |
| 8,969,182 B2* | 3/2015 | Koezuka | ............ | H01L 29/7869 257/52 |
| 9,000,438 B2* | 4/2015 | Jintyou | ............ | G02F 1/133524 257/43 |
| 9,449,996 B2* | 9/2016 | Yamazaki | ........... | H01L 27/1255 |
| 2005/0140868 A1* | 6/2005 | Hwang | ............ | G02F 1/133555 349/114 |
| 2009/0142905 A1* | 6/2009 | Yamazaki | ......... | H01L 21/76254 438/458 |
| 2012/0326143 A1* | 12/2012 | Tsurume | ............ | H01L 27/1225 257/43 |
| 2013/0002527 A1* | 1/2013 | Kim | ...................... | H01L 29/786 345/82 |
| 2013/0194205 A1* | 8/2013 | Park | ........................ | G06F 3/044 345/173 |
| 2013/0335344 A1* | 12/2013 | Han | ..................... | C09J 133/066 345/173 |
| 2015/0236080 A1* | 8/2015 | Cho | .................... | H01L 51/5281 257/40 |
| 2016/0064692 A1* | 3/2016 | Moon | ................. | H01L 51/5262 257/40 |
| 2016/0091742 A1* | 3/2016 | Chang | ................... | G02F 1/1362 257/43 |
| 2016/0126494 A1* | 5/2016 | Jung | .................. | H01L 27/3258 257/72 |
| 2016/0148987 A1* | 5/2016 | Popp | ..................... | H01L 27/288 257/40 |
| 2016/0190223 A1* | 6/2016 | Park | .................... | H01L 27/3276 257/40 |
| 2016/0282686 A1* | 9/2016 | Kubota | ............. | G02F 1/134363 |
| 2016/0322602 A1* | 11/2016 | Jung | .................. | H01L 51/0097 |

* cited by examiner

TRANSPARENT DISPLAY DEVICE AND METHOD OF MANUFACTURING THE SAME

This application claims priority to Korean Patent Application No. 10-2015-0131835, filed on Sep. 17, 2015, and all the benefits accruing therefrom under 35 U.S.C. § 119, the content of which in its entirety is herein incorporated by reference.

BACKGROUND

1. Field

Exemplary embodiments relate to transparent display devices and methods of manufacturing transparent display devices. More particularly, exemplary embodiments relate to transparent display devices including adhesive layers and methods of manufacturing the transparent display devices.

2. Description of the Related Art

Recently, a display device, e.g., an organic light-emitting display ("OLED") device having transparent or transmitting properties has been developed.

A transistor included in the display device may have a semiconductor layer containing amorphous silicon or polysilicon. Thus, a crystallization process such as a low temperature polycrystalline silicon ("LTPS") process may be performed for the semiconductor layer so as to crystallize the semiconductor layer.

Optimizing various variables such as a composition, a disposition and a thickness of various materials such as a substrate, an electrode, an insulation layer, etc. may be desired to manufacture a transparent display device.

SUMMARY

A plurality of insulation layers including different materials may be stacked to manufacture the OLED device, for example, such that an optical property of the OLED device may be reduced and a proper transmittance may be not easily obtained.

Moreover, an adhesion between the substrate and the insulation layer may be reduced during the crystallization process performed at a relatively high temperature, so that the insulation layer may be detached from the substrate.

Exemplary embodiments provide a transparent display device including an adhesive layer capable of increasing an adhesion strength between a base substrate and an insulation layer, and also of preventing a reduction of a transmittance.

Exemplary embodiments provide a method of manufacturing a transparent display device including an adhesive layer capable of increasing an adhesion strength between a base substrate and an insulation layer, and of preventing a reduction of a transmittance.

According to exemplary embodiments, a transparent display device may include a base substrate having a pixel area and a transmission area, a barrier layer disposed on the base substrate, a pixel circuit disposed on the base substrate in the pixel area, a display structure disposed on the pixel circuit, a transmitting structure disposed on the base substrate in the transmission area, an adhesive layer disposed between the base substrate and the barrier layer, and between the base substrate and the transmitting structure, and a transmitting window exposing the transmitting structure in the transmission area. The transmitting structure may include a composition including silicon oxynitride, and the adhesive layer may include aluminum oxide.

In exemplary embodiments, a refractive index of the adhesive layer may be in a range of about 1.6 to about 1.8.

In exemplary embodiments, a thickness of the adhesive layer may be in a range of about 5 nanometers (nm) to about 30 nm.

In exemplary embodiments, the adhesive layer may have a compressive stress therein.

In exemplary embodiments, the pixel circuit may include an active pattern, a gate electrode, a source electrode and a drain electrode. The transparent display device may further include a gate insulation layer disposed on the barrier layer to cover the active pattern, an insulating interlayer disposed on the gate insulation layer to cover the gate electrode and a via insulation layer disposed on the insulating interlayer to cover the source electrode and the drain electrode. The source electrode and the drain electrode may extend through the insulating interlayer and the gate insulation layer to contact the active pattern.

In exemplary embodiments, each of the barrier layer, the gate insulation layer and the insulating interlayer may include silicon oxynitride.

In exemplary embodiments, each of the barrier layer, the gate insulation layer and the insulating interlayer may extend from the pixel area to the transmission area. The transmitting structure may include portions of the barrier layer, the gate insulation layer and the insulating interlayer extended to the transmission area.

In exemplary embodiments, layers of the transmitting structure may be integrally combined with one another to have a single-layered structure.

In exemplary embodiments, the transparent display device may further include a buffer layer disposed between the barrier layer and the gate insulation layer.

In exemplary embodiments, each of the barrier layer, the buffer layer, the gate insulation layer and the insulating interlayer may include silicon oxynitride.

In exemplary embodiments, each of the barrier layer, the buffer layer, the gate insulation layer and the insulating interlayer may extend from the pixel area to the transmission area. The transmitting structure may include portions of the barrier layer, the buffer layer, the gate insulation layer and the insulating interlayer extended to the transmission area.

In exemplary embodiments, layers of the transmitting structure may be integrally combined with one another to have a single-layered structure.

In exemplary embodiments, the via insulation layer may be selectively disposed in the pixel area and may not extend to the transmission area.

In exemplary embodiments, the display structure may include a pixel electrode disposed on the via insulation layer, a display layer disposed on the pixel electrode, and an opposing electrode disposed on the display layer to face the pixel electrode. The pixel electrode may extend through the via insulation layer to contact the drain electrode. The transparent display device may further include a pixel defining layer partially covering the pixel electrode on the via insulation layer.

In exemplary embodiments, the pixel defining layer may be selectively disposed in the pixel area and may not extend to the transmission area.

In exemplary embodiments, the opposing electrode may be disposed along surfaces of the pixel defining layer and the display layer, and a sidewall and a bottom face of the transmitting window. A thickness of a portion of the opposing electrode on the sidewall and the bottom face of the transmitting window may be smaller than a thickness of a portion of the opposing electrode on the surfaces of the pixel defining layer and the display layer.

In exemplary embodiments, the opposing electrode may be selectively disposed in the pixel area and may not extend to the transmission area.

According to exemplary embodiments, in a method of manufacturing a transparent display device, a base substrate that has a pixel area and a transmission area may be provided, and then an adhesive layer may be disposed on the base substrate using aluminum oxide. A barrier layer may be disposed on the adhesive layer using silicon oxynitride. A pixel circuit may be disposed on the barrier layer, and then a insulation layer that covers the pixel circuit may be disposed on the barrier layer. A display structure may be disposed on the insulation layer.

In exemplary embodiments, the adhesive layer may have a compressive stress therein.

In exemplary embodiments, a semiconductor layer may be disposed on the barrier layer, and then a crystallization process may be performed on the semiconductor layer. The crystallization process may be performed at a temperature in a range of about 380 degrees Celsius (° C.) to about 500° C.

According to exemplary embodiments, the transparent display device may include the adhesive layer including aluminum oxide which is formed between the base substrate and the barrier layer. Accordingly, a detachment of the barrier layer from the base substrate during a relatively high temperature process, e.g., the crystallization process may be prevented by increasing an adhesion between the base substrate and the barrier layer, and a change of a refractive index according to a change of composition or material of the base substrate and the layers may also be prevented. Therefore, the transparent display device with an increased adhesion and an improved transmittance may be obtained.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

Figure 1:
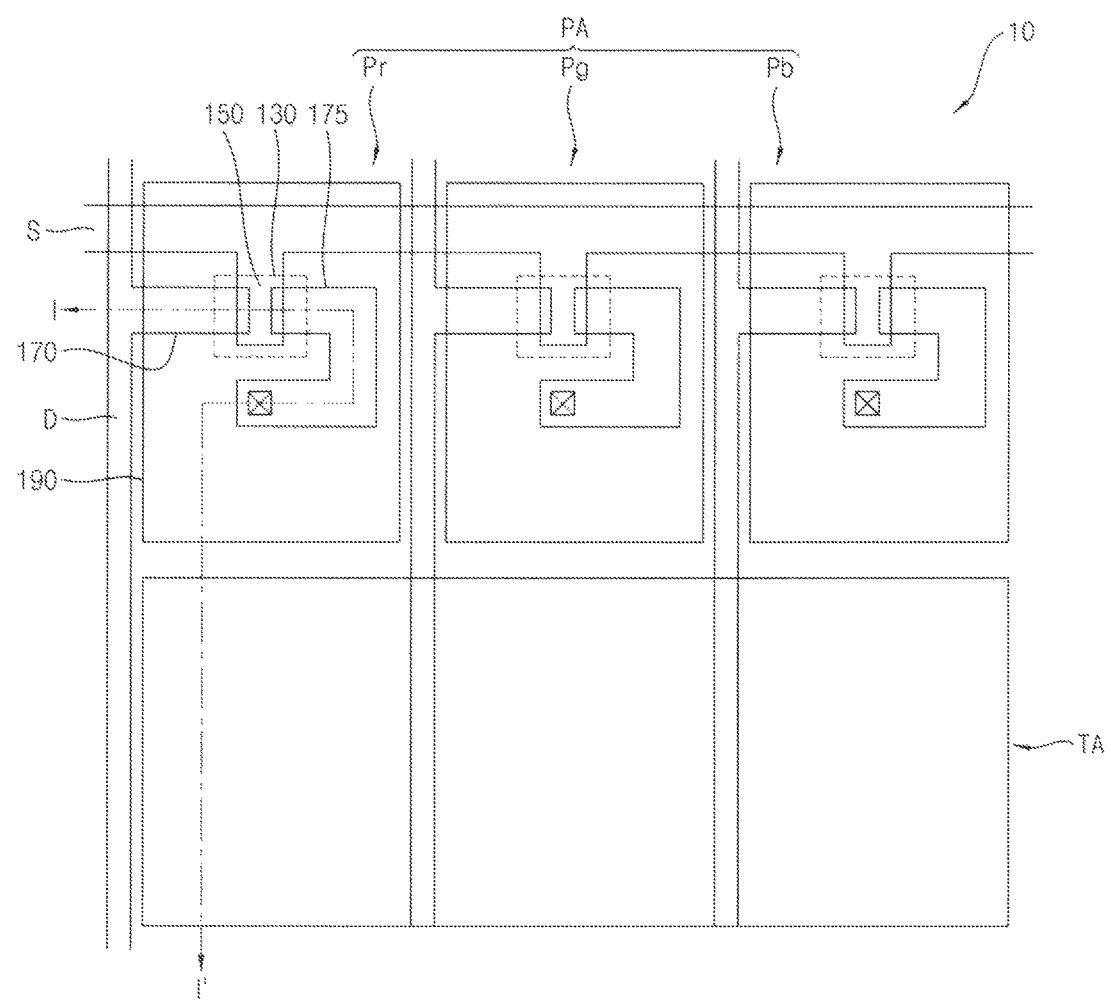
FIG. 1 is a plan view illustrating exemplary embodiments of a transparent display device in accordance with the invention.

Hereinafter, transparent display devices and methods of manufacturing transparent display devices in accordance with exemplary embodiments will be explained in detail with reference to the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
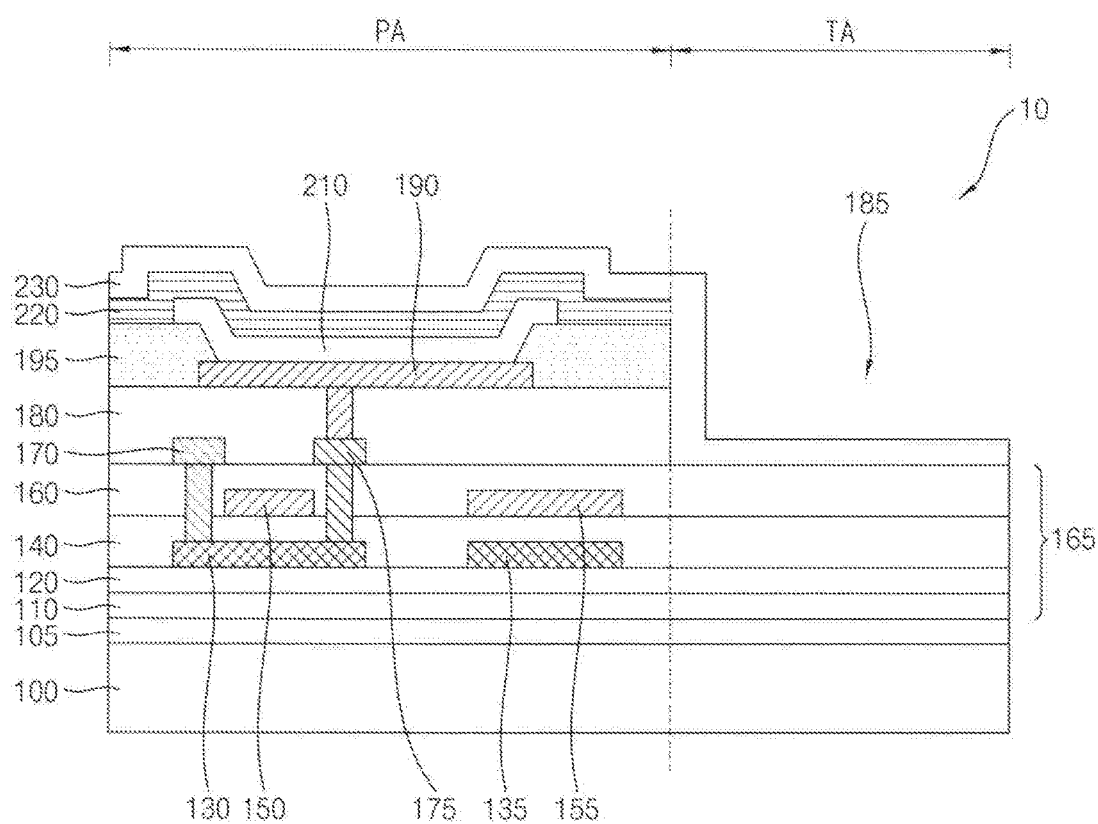
FIGS. 2 and 3 are cross-sectional views illustrating exemplary embodiments of a transparent display device in accordance with the invention.
Figure 3:
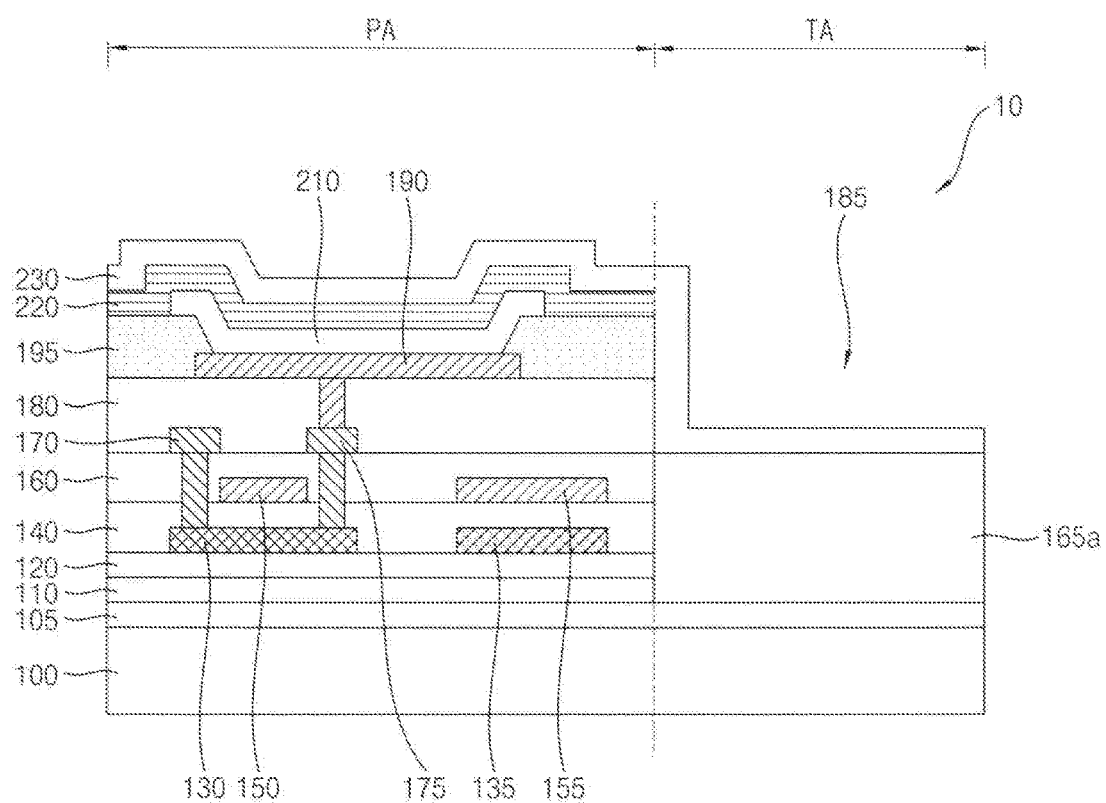

FIG. 1 is a plan view illustrating a transparent display device in accordance with exemplary embodiments. FIGS. 2 and 3 are cross-sectional views illustrating a transparent display device in accordance with exemplary embodiments. In an exemplary embodiment, each of FIGS. 2 and 3 are cross-sectional views taken along a line I-I' in FIG. 1. Although an organic light-emitting display device is illustrated in FIGS. 2 and 3 as the transparent display device, a invention may be not limited thereto, and may be applied to various display devices, e.g., a liquid crystal display device.

Referring to FIGS. 1 and 2, a transparent display device 10 may include a pixel area PA and a transmission area TA.

The pixel area PA may include a red pixel Pr, a green pixel Pg and a blue pixel Pb adjacent to one another. The transmission area TA may be adjacent to the pixel area PA. As illustrated in FIG. 1, the transmission area TA may extend to be adjacent to the red pixel Pr, the green pixel Pg and the blue pixel Pb. In exemplary embodiments, individually patterned transmission area may be provided for each of the pixels such as the red pixel Pr, the green pixel Pg and the blue pixel Pb.

A transistor, e.g., a thin film transistor ("TFT") may be provided in each pixel, and the transistor may be electrically connected to a data line D and a scan line S. As illustrated in FIG. 1, the data line D and the scan line S may cross each other, and the pixels may be defined in intersection regions provided by the data line D and the scan line S. A pixel circuit for each pixel may be defined by the data line D, the scan line S and the transistor.

Although is it not illustrated in FIG. 1, in an exemplary embodiment, the pixel circuit may additionally include a power line that may be substantially parallel to the date line D. In the exemplary embodiment, the pixel circuit may additionally include a capacitor electrically connected to the power line and the transistor.

FIGS. 1 and 2 illustrate one transistor provided in each of the red pixel Pr, the green pixel Pg and the blue pixel Pb, but the invention is not limited thereto, and equal to or more than two transistors may be disposed in each of the red pixel Pr, the green pixel Pg and the blue pixel Pb. In an exemplary embodiment, a switching transistor and a driving transistor may be provided in each of the pixels Pr, Pg and Pb. Here, the capacitor may be electrically connected between the switching transistor and the driving transistor.

As illustrated in FIG. 2, the transistor and the capacitor may be disposed on a buffer layer 120 located on a base substrate 100 in the pixel area PA. The transistor may include a first active pattern 130, a gate insulation layer 140, a first gate electrode 150, an insulating interlayer 160, a source electrode 170, and a drain electrode 175. A via insulation layer 180 may substantially cover the transistor and a pixel electrode 190, and also a pixel defining layer ("PDL") 195 may be disposed on the via insulation layer 180. A display layer 210, an opposing electrode 220 and an encapsulation layer 230 may be sequentially located on the pixel electrode 190 and the PDL 195.

The capacitor may include a second active pattern 135, the gate insulation layer 140 and a second gate electrode 155, and may locate on the buffer layer 120.

A transparent insulation substrate may be used as the base substrate 100. In an exemplary embodiment, the base substrate 100 may include polymer having transmitting and flexible properties, for example. In exemplary embodiments, the base substrate 100 may include polyimide-based resin, for example. The base substrate 100 may be divided into the pixel area PA and the transmission area TA as described above.

A barrier layer 110 and the buffer layer 120 may be sequentially disposed on the base substrate 100. The barrier layer 110 and the buffer layer 120 may substantially cover an entire surface of the base substrate 100.

The barrier layer 110 may substantially block diffusion of moistures and/or impurities toward overlying structures through the base substrate 100. The diffusion of the moistures and/or impurities may be additionally prevented by the buffer layer 120, and also a stress generated between the base substrate 100 the overlying structures may be reduced or absorbed by the buffer layer 120.

In exemplary embodiments, each of the barrier layer 110 and the buffer layer 120 may include silicon oxynitride (SiOxNy), for example. In exemplary embodiments, each of the barrier layer 110 and the buffer layer 120 may include a composition substantially including silicon oxynitride only. That is, the barrier layer 110 may include a composition substantially the same as that of the buffer layer 120.

In other exemplary embodiments, one of the barrier layer 110 and the buffer layer 120 may be omitted. In this case, a single layered barrier layer 110 substantially including silicon oxynitride may be disposed only on the base substrate 100.

An adhesive layer 105 may be positioned between the base substrate 100 and the barrier layer 110. The adhesive layer 105 may substantially cover the entire surface of the base substrate 100.

The adhesive layer 105 may prevent the barrier layer 110 from being detached from the base substrate 100. When an insulation layer such as the barrier layer 110 is disposed on a chemically inactive transparent insulation substrate such as the base substrate 100, an adhesion strength between the transparent insulation substrate and the insulation layer may be relatively low. In this case, the insulation layer may be detached or lifted from the transparent insulation substrate in a subsequent crystallization process like a low temperature polycrystalline silicon ("LTPS") for crystallizing a semiconductor layer performed at a required temperature. The transparent display device 10 according to exemplary embodiments may include the adhesive layer 105 located between the base substrate 100 and the barrier layer 110, such that the detachment or lift of the barrier layer 110 from the base substrate 100 may be efficiently reduced or prevented.

In an exemplary embodiment, the adhesive layer 105 may include aluminum oxide ($Al_xO_y$), for example. In exemplary embodiments, the adhesive layer 105 may include a composition substantially including aluminum oxide only.

In exemplary embodiments, the adhesive layer 105 may include aluminum oxide which has a refractive index in a range of about 1.6 to about 1.8, for example. When the base substrate 100 includes polyimide-based resin, a refractive index of the base substrate 100 may be about 1.7, for example. Therefore, a total reflection of light by a drastic change of the refractive index may be minimized so as to increase a transmittance of the transparent display device 10.

In exemplary embodiments, the adhesive layer 105 may have a thickness between about 5 nanometers (nm) and about 30 nm, for example. When a thickness of the adhesive layer 105 is less than 5 nm, the adhesive layer 105 may not be uniformly disposed on the base substrate 100. When the thickness of the adhesive layer 105 is greater than 30 nm, the transmittance of the transparent display device 10 may decrease, and a manufacturing cost may increase.

In exemplary embodiments, the adhesive layer 105 may have a compressive stress applied thereto. In an exemplary embodiment, the adhesive layer 105 may be deposited by a chemical vapor deposition ("CVD") process, for example. Here, the adhesive layer 105 may have the compressive stress generated in the process of forming the adhesive layer 105 depending on process conditions of the CVD process such as a temperature, a processing time, a source gas, a carrier gas, etc.

An active pattern may be disposed on the buffer layer 120 in the pixel area PA. The active pattern may include the first active pattern 130 and the second active pattern 135.

The active pattern may include polysilicon. In exemplary embodiments, a source region and a drain region, which may include p-type or n-type impurities, may be positioned at both end portions of the first active pattern 130. The second active pattern 135 may also include impurities, and the impurities may be substantially distributed throughout the second active pattern 135.

In exemplary embodiments, the active pattern may include oxide semiconductor such as indium gallium zinc oxide ("IGZO"), zinc tin oxide ("ZTO"), indium tin zinc oxide ("ITZO"), etc.

As illustrated in FIG. 2, the first and the second active patterns 130 and 135 may be located on substantially the same level or substantially the same plane over the base substrate 100.

The gate insulation layer 140 may be disposed on the buffer layer 120 to substantially cover the first and the second active patterns 130 and 135. In exemplary embodiments, the gate insulation layer 140 may include a composition including only one of silicon oxide, silicon nitride and silicon oxynitride. In exemplary embodiments, the gate insulation layer 140 may have a single-layered structure substantially including silicon oxynitride similar to the structure of the barrier layer 110 and/or the buffer layer 120.

A gate electrode may be disposed on the gate insulation layer 140. In exemplary embodiments, the gate electrode may include the first gate electrode 150 and the second gate electrode 155. The first gate electrode 150 and the second gate electrode 155 may be positioned on portions of the gate insulation layer 140 under which the first active pattern 130 and the second active pattern 135 are located, respectively.

The first gate electrode 150 may be electrically connected to the scan line S. In an exemplary embodiment, the first gate electrode 150 may be branched from the scan line S. The first and the second gate electrodes 130 and 135 may be positioned on substantially the same level or substantially the same plane over the base substrate 100.

In an exemplary embodiment, the gate electrode may include a metal, an alloy, a metal nitride, etc., for example. In an exemplary embodiment, the gate electrode may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), alloys thereof, nitrides thereof, etc., for example. These may be used alone or in a combination thereof. In exemplary embodiments, the gate electrode may have a double-layered structure such as an Al/Mo structure or a Ti/Cu structure so as to reduce a resistance of the gate electrode.

The insulating interlayer 160 may be disposed on the gate insulation layer 140 to substantially cover the first and the second gate electrodes 150 and 155. In exemplary embodiments, the insulating interlayer 160 may include a composition including only one of silicon oxide, silicon nitride and silicon oxynitride, for example. In an exemplary embodiment, the insulating interlayer 160 may have a single-layered structure substantially including silicon oxynitride similar to the structure of the barrier layer 110 and/or the buffer layer 120.

The source electrode 170 and the drain electrode 175 may pass through the insulating interlayer 160 and the gate insulation layer 140 to thereby contact the first active pattern 130. In an exemplary embodiment, each of the source electrode 170 and the drain electrode 175 may include a metal, an alloy, a metal nitride, etc., for example. In an exemplary embodiment, each of the source and the drain electrodes 170 and 175 may include Al, Ag, W, Cu, Ni, Cr, Mo, Ti, Pt, Ta, Nd, Sc, alloys thereof, nitrides thereof, etc., for example. These may be used alone or in a combination thereof. In exemplary embodiments, each of the source electrode 170 and the drain electrode 175 may include at least two different metal layers, for example, an Al layer and an Mo layer.

The source electrode 170 and the drain electrode 175 may contact the source region and the drain region of the first active pattern 130, respectively. In this case, a portion of the first active pattern 130 between the source region and the drain region may serve as a channel through which charges may be moved.

The source electrode 170 may be electrically connected to the data line D. In an exemplary embodiment, the source electrode 170 may be branched from the data line D.

The transistor may include the first active pattern 130, the gate insulation layer 140, the first gate electrode 150, the source electrode 170, and the drain electrode 175. Further, the capacitor may include the second active pattern 135, the gate insulation layer 140, and the second gate electrode 155.

FIG. 2 illustrates that the transistor has a top-gate structure in which the first gate electrode 150 is disposed over the first active pattern 130. In an alternative exemplary embodiment, the transistor may have a bottom-gate structure in which the first gate electrode 150 is disposed under the first active pattern 130.

As illustrated in FIG. 2, each of the barrier layer 110, the buffer layer 120, the gate insulation layer 140 and the insulating interlayer 160 may extend on the base substrate 100 from the pixel area PA to the transmission area TA. Accordingly, a transmitting structure 165 including portions of the barrier layer 110, the buffer layer 120, the gate insulation layer 140 and the insulating interlayer 160 may be provided on the adhesive layer 105 in the transmission area TA in which the transistor and the capacitor may not be positioned.

As described above, according to exemplary embodiments, each of the barrier layer 110, the buffer layer 120, the gate insulation layer 140 and the insulating interlayer 160 may have a single-layered structure substantially including silicon oxynitride, for example. In this case, the transmitting structure 165 may include a composition substantially including silicon oxynitride only, for example.

In case that transparent display device includes a barrier layer, a buffer layer, a gate insulation layer and an insulating interlayer which have a entirely stacked structure including silicon oxide and silicon nitride, for example. In an exemplary embodiment, the barrier layer or the buffer layer may include silicon nitride so as to block a diffusion of moisture, for example. However, when a plurality of silicon nitride layers are stacked, stresses may be increased among the silicon nitride layers so that a deterioration of a stacked structure, e.g., a TFT of the transparent display device may be caused. Thus, a silicon oxide layer may be additionally included for absorbing or buffering the stresses generated among the silicon nitride layers.

When silicon oxide layers and silicon nitride layers are alternately and repeatedly stacked, a plurality of interfaces may be provided among multiple layers. In case that an external light is incident into a transmission area TA, a total reflection or an interference of the light may be caused due to a difference of refractive indices at the interfaces among the layers. Thus, a transmittance of the transparent display device may entirely decrease. However, according to exemplary embodiments, each of the barrier layer 110, the buffer layer 120, the gate insulation layer 140 and the insulating interlayer 160 may include the composition including silicon oxynitride only, for example. Therefore, the number of an interfaces among those layers may be substantially reduced, and a variation in refractive indices caused by different compositions or materials may be substantially prevented. As a result, a transmittance in the transmission area TA may be improved.

In an exemplary embodiment, each of the barrier layer 110, the buffer layer 120, the gate insulation layer 140 and the insulating interlayer 160 may include silicon oxynitride which may have advantages of silicon oxide and silicon nitride. In an exemplary embodiment, each of the barrier layer 110, the buffer layer 120, the gate insulation layer 140 and the insulating interlayer 160 may sufficiently prevent a diffusion of moistures and/or impurities from an outside while preventing excessive stresses from being generated therebetween.

In exemplary embodiments, each of the barrier layer 110, the buffer layer 120, the gate insulation layer 140 and the insulating interlayer 160 may include silicon oxynitride ($SiO_xN_y$), for example. In an exemplary embodiment, each of those layers 110, 120, 140 and 160 may have a vertical concentration gradient of oxygen and nitrogen, for example. Accordingly, values of "x" and "y" in each of those layers 110, 120, 140 and 160 may substantially vary along a vertical direction.

In an exemplary embodiment, in the buffer layer 120, a portion adjacent to a surface of the barrier layer 110 may have a relatively nitrogen-rich concentration (e.g., y is greater than x), for example. Thus, the diffusion of moistures and/or impurities may be effectively prevented at an interface between the barrier layer 110 and the buffer layer 120.

Moreover, a portion of the buffer layer 120 adjacent to the gate insulation layer 140 may have a relatively oxygen-rich concentration (e.g., x is greater than y). Hence, a stress caused by the first and the second active patterns 130 and 135 may be effectively reduced or absorbed.

In an exemplary embodiment, in the gate insulation layer 140, a portion adjacent to the buffer layer 120 or the first and the second active patterns 130 and 135 may have a relatively oxygen-rich concentration (e.g., x is greater than y), for example. Therefore, the gate insulation layer 140 may adequately match with the buffer layer 120 so that a stress generated between the buffer layer 120 and the gate insulation layer 140 may be efficiently reduced or absorbed.

Furthermore, a portion of the gate insulation layer 140 adjacent to the insulating interlayer 160 or the first and the second gate electrodes 150 and 155 may have a relatively nitrogen-rich concentration (e.g., y is greater than x). Thus, a diffusion of impurities among between the first and the second gate electrodes 150 and 155, and the first and the second active patterns 130 and 135 may be effectively inhibited.

In an exemplary embodiment, when the base substrate 100 includes polyimide-based resin, a refractive index of the base substrate 100 may be about 1.7, for example. In exemplary embodiments, as described above, the adhesive layer 105 may include aluminum oxide having a refractive index ranging from about 1.6 to about 1.8, for example. Further, each of the barrier layer 110, the buffer layer 120, the gate insulation layer 140 and the insulating interlayer 160 may include silicon oxynitride having a refractive index ranging from about 1.6 to about 1.8, for example. Therefore, a total reflection of light due to a drastic change of the refractive indices may be avoided, so that a transmittance of the transparent display device 10 may be improved.

The via insulation layer 180 may be disposed on the insulating interlayer 160 to substantially cover the source electrode 170 and the drain electrode 175. A via structure for electrically connecting the pixel electrode 190 to the drain electrode 175 may be provided in the via insulation layer 180. Further, the via insulation layer 180 may substantially serve as a planarization layer. In an exemplary embodiment, the via insulation layer 180 may include an organic material such as polyimide, epoxy-based resin, acryl-based resin, polyester, or the like.

In exemplary embodiments, the via insulation layer 180 may be selectively disposed in the pixel area PA while may not extend to the transmission area TA. Accordingly, the organic material different from a material included in the transmitting structure 165 may substantially not be present in the transmission area TA. Thus, a reduction of the transmittance caused by the via insulation layer 165 may be prevented.

The pixel electrode 190 may locate on the via insulation layer 180, and may include the via structure electrically connected to the drain electrode 175 through the via insulation layer 180. In exemplary embodiments, individual pixel electrodes 190 may be provided in the pixels, respectively.

In exemplary embodiments, the pixel electrode 190 may function as a reflective electrode. In an exemplary embodiment, the pixel electrode 190 may include a metal, for example, Al, Ag, W, Cu, Ni, Cr, Mo, Ti, Pt, Ta, Nd or Sc, or alloys thereof.

In exemplary embodiments, the pixel electrode 190 may include a transparent conductive material having a relatively high work function. In an exemplary embodiment, the pixel electrode 190 may include indium tin oxide ("ITO"), indium zinc oxide ("IZO"), zinc oxide, indium oxide, etc., for example.

In other exemplary embodiments, the pixel electrode 190 may have a multi-layered structure including the above transparent conductive material and the above metal.

The pixel defining layer ("PDL") 195 may be positioned on the via insulation layer 180. The PDL 195 may substantially cover a peripheral portion of the pixel electrode 190. The PDL 195 may include, e.g., a transparent organic material such as polyimide-based resin or acryl-based resin.

In exemplary embodiments, the PDL 195 may be selectively disposed on a portion of the via insulation layer 180 in the pixel area PA, and may at least partially expose the pixel electrode 190. Thus, the PDL 195 may not extend to the transmission area TA. In exemplary embodiments, sidewalls of the PDL 195 and the via insulation layer 180 may be located on substantially the same level or substantially the same plane over the base substrate 100.

Additionally, a transmitting window 185 may be defined by the sidewalls of the PDL 195 and the via insulation layer 180 and a surface of the transmitting structure 165 in the transmission area TA.

The display layer 210 may be disposed on the PDL 195 and the pixel electrode 190. The display layer 210 may be individually provided in the pixels Pr, Pg and Pb. In an exemplary embodiment, the display layer 210 may include organic light emitting layers individually located in the red pixel Pr, the green pixel Pg, and the blue pixel Pb, for example, so as to generate different colors of light, e.g., a red color of light, a green color of light, or a blue color of light. Each of the organic light-emitting layer may include a host material excited by holes and electrons, and a dopant material for facilitating an absorbance and a release of energy and improving a light-emitting efficiency.

In exemplary embodiments, the display layer 210 may further include a hole transport layer ("HTL") interposed between the pixel electrode 190 and the organic light-emitting layer. The display layer 210 may further include an electron transport layer ("ETL") interposed between the opposing electrode 220 and the organic light-emitting layer.

In an exemplary embodiment, the HTL may include a hole transport material, e.g., 4,4'-bis[N-(1-naphtyl)-N-phenyl amino]biphenyl ("NPB"), 4,4'-bis[N-(3-methylphenyl)-N-phenylamino] biphenyl ("TPD"), N,N'-di-1-naphtyl-N,N'-diphenyl-1,1'-biphenyl-4,4'-diamine ("NPD"), N-phenylcarbazole, polyvinylcarbazole, or a combination thereof, for example.

In an exemplary embodiment, the ETL may include an electron transport material, e.g., tris(8-quinolinolato)aluminum (Alq3), 2-(4-biphenylyl)-5-4-tert-butylphenyl-1,3,4-oxadiazole ("PBD"), bis(2-methyl-8-quinolinolato)-4-phenylphenolato-aluminum (BAlq), bathocuproine ("BCP"), triazole ("TAZ"), phenylquinozaline, or a combination thereof, for example.

In exemplary embodiments, the display layer 210 may include liquid crystal layers instead of the organic light-emitting layers. In this case, the transparent display device 10 may correspond to a liquid crystal display ("LCD") device.

As illustrated in FIG. 2, the display layer 210 may be located on a sidewall of the PDL 195 and on a surface of the pixel electrode 190 exposed by the PDL 195. The display layer 210 may extend partially onto a surface of the PDL 195. In exemplary embodiments, the display layer 210 may be confined by the sidewall of the PDL 195, so that the display layer 210 may be individually disposed in each of the pixels.

In exemplary embodiments, the HTL and/or the ETL included in the display layer 210 may extend to a plurality of pixels, such that the plurality of pixels may share the HTL and/or the ETL.

The opposing electrode 220 may be disposed on the PDL 195 and the display layer 210. The opposing electrode 220 may substantially face the pixel electrode 190 by interposing the display layer 210 therebetween.

In exemplary embodiments, the opposing electrode 220 may serve as a common electrode provided for the plurality of the pixels. The pixel electrode 190 and the opposing electrode 220 may function as an anode and a cathode of the transparent display device 10, respectively. In an exemplary embodiment, the opposing electrode 220 may include a metal having a relatively low work function such as Al, Ag, W, Cu, Ni, Cr, Mo, Ti, Pt, Ta, Nd, or Sc, or alloys thereof.

As illustrated in FIG. 2, the display layer 210 and the opposing electrode 220 may be selectively positioned in the pixel area PA, and may not extend to the transmission area TA. Hence, only the transmitting structure 165 may be exposed by the transmitting window 185, and a reduction of a transmittance in the transmission area TA may be minimized.

The encapsulation layer 230 may extend from the pixel area PA to the transmission area TA so as to substantially cover the opposing electrode 220 and the transmitting structure 165.

In an exemplary embodiment, the encapsulation layer 230 may include an inorganic material, e.g., silicon nitride and/or metal oxide. In exemplary embodiments, the encapsulation layer 230 may include silicon oxynitride substantially the same as or similar to that of the transmitting structure 165. Accordingly, compositions of the layers in the transmission area TA may be unified, and thus a reduction of a transmittance by a total reflection or an interference of light may be minimized.

In exemplary embodiments, a capping layer (not illustrated) may be interposed between the opposing electrode 220 and the encapsulation layer 230. In an exemplary embodiment, the capping layer may include an organic material such as polyimide resin, epoxy resin or acryl resin, or inorganic material such as silicon oxide, silicon nitride or silicon oxynitride.

Referring back to FIG. 3, a transmitting structure 165a in the transmission area TA may include a composition substantially including silicon oxynitride only. Accordingly, the transmitting structure 165a may have a substantially single-layered structure.

In the pixel area PA, the barrier layer 110, the buffer layer 120, the gate insulation layer 140 and the insulating interlayer 160 may be sequentially disposed on the base substrate 100 while providing elements of the pixel circuit such as the first and the second active patterns 130 and 135, the first and the second gate electrodes 150 and 155, etc. Here, manufacturing processes including a thermal treatment and etching processes may be performed for the formation of the components the pixel area PA such that interfaces among the barrier layer 110, the buffer layer 120, the gate insulation layer 140 and the insulating interlayer 160 may be created. However, as for the transmitting structure 165a disposed in the transmission area TA, each of the barrier layer 110, the buffer layer 120, the gate insulation layer 140 and the insulating interlayer 160 including a substantially single composition including silicon oxynitride may be sequentially disposed without interventions of other structures or materials.

Accordingly, the barrier layer 110, the buffer layer 120, the gate insulation layer 140 and the insulating interlayer 160 may be substantially integrally combined with one another in the transmission area TA, such that the transmitting structure 165a having the substantially single-layered structure may be provided as illustrated in FIG. 3.

Figure 4:
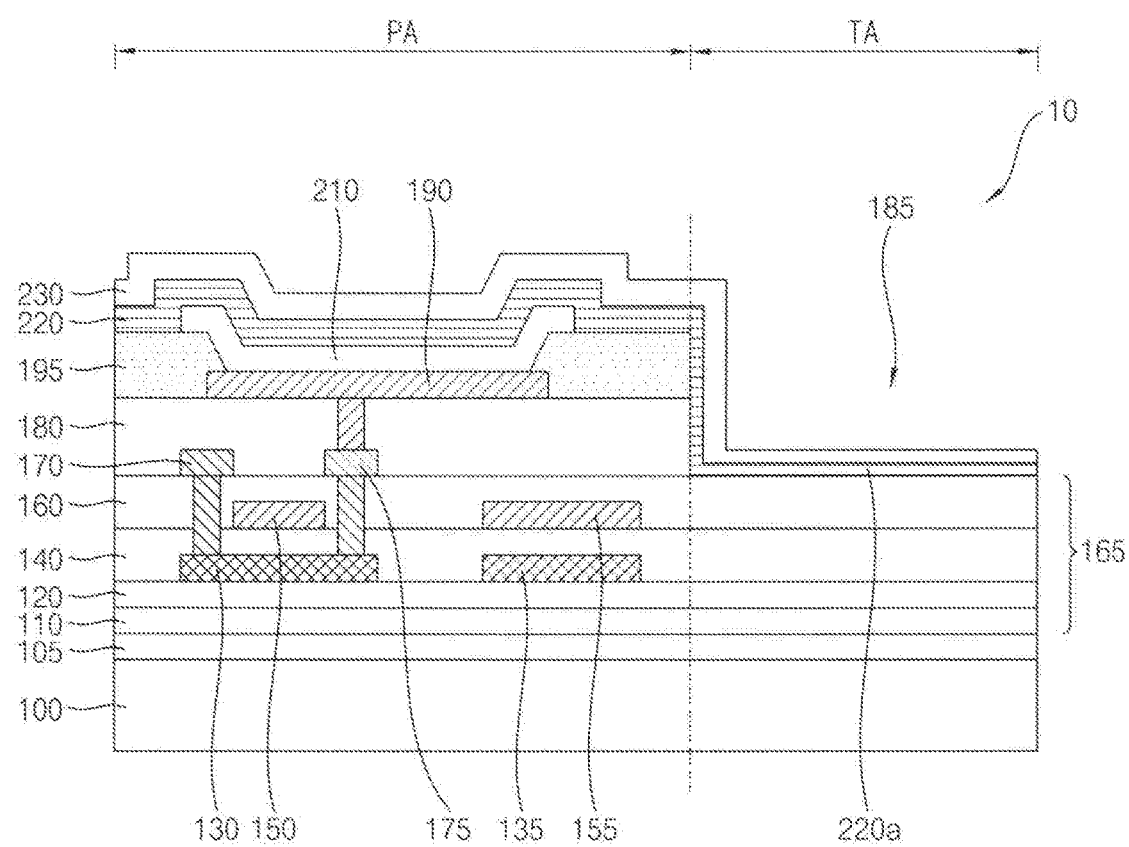
FIG. 4 is a cross-sectional view illustrating exemplary embodiments of a transparent display device in accordance with the invention.

FIG. 4 is a cross-sectional view illustrating a transparent display device in accordance with exemplary embodiments. Detailed description of elements illustrated in FIG. 4, which are substantially the same as or similar to those described with reference to FIGS. 1 to 3, will not be repeated.

Referring to FIG. 4, the opposing electrode 220 may extend continuously from the pixel area PA to the transmission area TA. In this case, the opposing electrode 220 may be disposed along surfaces of the PDL 195 and the display layer 210, and also along a sidewall and a bottom of the transmitting window 185.

In exemplary embodiments, a thickness of a portion 220a of the opposing electrode 220 in the transmission area TA may be substantially less than a thickness of the opposing electrode 220 in the pixel area PA. In an exemplary embodiment, as illustrated in FIG. 4, the portion 220a of the opposing electrode 220 in the transmission area TA may be positioned on the sidewall and the bottom of the transmitting window 185 while having a thickness smaller than the thickness of the opposing electrode 220 in the pixel area PA, for example. Accordingly, a reduction of a transmittance by the portion 220a of the opposing electrode 220 may be prevented.

The encapsulation layer 230 may be disposed on the entire opposing electrode 220 to substantially cover both the pixel area PA and the transmission area TA.

FIGS. 5 to 11 are cross-sectional views illustrating a method of manufacturing a transparent display device in accordance with exemplary embodiments.

Figure 5:
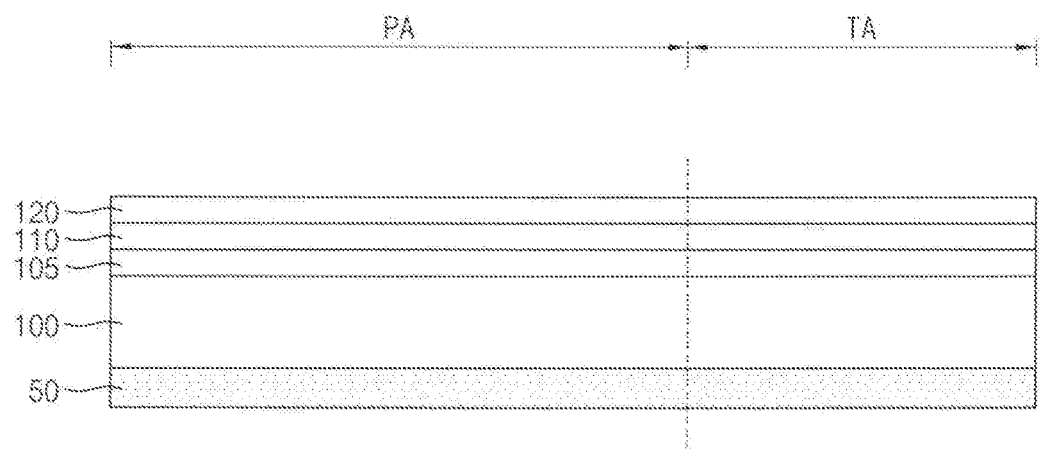
FIGS. 5 to 11 are cross-sectional views illustrating exemplary embodiments of a method of manufacturing a transparent display device in accordance with the invention.

Referring to FIG. 5, a base substrate 100 may be disposed on a carrier substrate 50, and then an adhesive layer 105 may be disposed on the base substrate 100. An barrier layer 110 and a buffer layer 120 may be sequentially disposed on the adhesive layer 105. The base substrate 100 may have a pixel area PA and a transmission area TA. The adhesive layer 105, the barrier layer 110 and the buffer layer 120 may be provided in the pixel area PA and the transmission area TA.

The carrier substrate 50 may support the base substrate 100 while performing manufacturing processes for the transparent display device. In an exemplary embodiment, a glass substrate or a metal substrate may be used as the carrier substrate 50, for example.

In an exemplary embodiment, the base substrate 100 may be provided using transparent polymer resin, e.g., polyimide-based resin. In an exemplary embodiment, a precursor composition including a polyimide precursor may be coated on the carrier substrate 50 by a spin coating process so as to provide a coating layer on the carrier substrate 50, for example. This coating layer may be thermally treated to provide the base substrate 100 on the carrier substrate 50.

In an exemplary embodiment, the polyimide precursor may include diamine and dianhydride, for example. In an exemplary embodiment, the precursor composition may be prepared by dissolving the polyimide precursor in an organic solvent, for example. In an exemplary embodiment, the organic solvent may include, e.g., N-methyl-2-pyrrolidone ("NMP"), dimethylformamide ("DMF"), tetrahydrofuran ("THF"), triethylamine ("TEA"), ethylacetate (ethylacetate), dimethylsulfoxide ("DMSO"), an ethylene glycol-based ether solvent, etc., for example. These may be used alone or in a combination thereof.

A polymerization reaction of diamine and dianhydride may be initiated by the thermal treatment process to provide a polyamic acid structure, and then the polyamic acid structure may be further thermally treated such that a condensation reaction may occur to provide the polyimide-based resin.

In an exemplary embodiment, the adhesive layer 105 may be provided using aluminum oxide, for example. In exemplary embodiments, the adhesive layer 105 may be substantially includes aluminum oxide only. In an exemplary embodiment, the adhesive layer 105 may be provided by a chemical vapor deposition ("CVD") process, a plasma enhanced chemical vapor deposition ("PECVD") process, a high density plasma-chemical vapor deposition ("HDP-CVD") process, etc., for example.

In exemplary embodiments, the adhesive layer 105 may have a compressive stress therein. In an exemplary embodiment, when the adhesive layer 105 is provided by the CVD process, the adhesive layer 105 may have the compressive stress depending process conditions of the CVD process, for example.

In an exemplary embodiment, each of the barrier layer 110 and the buffer layer 120 may be provided using silicon oxynitride, for example. In exemplary embodiments, each of the barrier layer 110 and the buffer layer 120 may substantially includes silicon oxynitride only, for example. In an exemplary embodiment, each of the barrier layer 110 and the buffer layer 120 may be provided by a CVD process, a PECVD process, an HDP-CVD process, etc., for example. In an exemplary embodiment, the carrier substrate 50 having the base substrate 100 thereon may be loaded in a process chamber, and then a silicon oxide precursor and a nitrogen source may be introduced onto the base substrate 100 to provide the barrier layer 110 and the buffer layer 120 on the base substrate 100.

In an exemplary embodiment, the silicon oxide precursor may include, e.g., tetraethyl orthosilicate ("TEOS") or plasma enhanced oxide ("PEOX"). In an exemplary embodiment, the nitrogen source may include ammonia ($NH_3$), nitrous oxide ($N_2O$), or the like, for example.

In exemplary embodiments, a silicon source and an oxygen source may be separately introduced in the process chamber instead of the silicon oxide precursor. In an exemplary embodiment, the silicon source may include silane ($SiH_4$), disilane ($Si_2H_6$), dichlorosilane ($SiH_2Cl_2$), or the like. In an exemplary embodiment, the oxygen source may include, e.g., oxygen ($O_2$) or ozone ($O_3$).

In exemplary embodiments, a flow rate of the nitrogen source may be controlled so that at least one of the barrier layer 110 and the buffer layer 120 may have a relatively vertical concentration gradients of oxygen and nitrogen therein.

When the buffer layer 120 is disposed on the barrier layer 110, the silicon oxide precursor (or the silicon source and the oxygen source) and the nitrogen source may be introduced together into the process chamber, and then the flow rate of the nitrogen source may be gradually decreased. Accordingly, a content of nitrogen in the buffer layer 120 may be gradually decreased from an interface between the buffer layer 120 and the barrier layer 110 to a surface of the buffer layer 120. As a result, a lower portion of the buffer layer 120 may include a relatively nitrogen-rich silicon oxynitride, and an upper portion of the buffer layer 120 may include a relatively oxygen-rich silicon oxynitride.

In exemplary embodiments, the nitrogen source may include different kinds of nitrogen including gases. In an exemplary embodiment, $NH_3$ and $N_2O$ may be used together as the nitrogen source, for example. Further, a flow rate ratio of $NH_3$ to $N_2O$ ($NH_3/N_2O$) may be controlled such that a refractive index of the barrier layer 110 and/or the buffer layer 120 may be adjusted. In an exemplary embodiment, when the base substrate 100 includes polyimide-based resin, a refractive index of the base substrate 100 may be about 1.7, for example. In an exemplary embodiment, the above flow rate ratio may be controlled so that the barrier layer 110 and/or the buffer layer 120 may have a refractive index ranging from about 1.6 to about 1.8 to thereby improve an optical matching relative to the base substrate 100 and the adhesive layer 105, for example.

In exemplary embodiments, the flow rate ratio of $NH_3$ to $N_2O$ may be controlled to a range of about 1 to about 5, for example. In an alternative exemplary embodiment, this flow rate ratio may be adjusted to a range of about 1.5 to about 3.0, for example.

In exemplary embodiments, one of the barrier layer 110 and the buffer layer 120 may be omitted. Here, the barrier layer 120 including a composition substantially including silicon oxynitride only may be disposed on the base substrate 100.

In exemplary embodiments, the barrier layer 110 and the buffer layer 120 may include substantially the same composition, so that the barrier layer 110 and the buffer layer 120 may be substantially integrally combined with each other. Thus, a single-layered structure including the integrally combined barrier layer 110 and the buffer layer 120, which may include a composition substantially including silicon oxynitride only, may be disposed on the base substrate 100.

Figure 6:
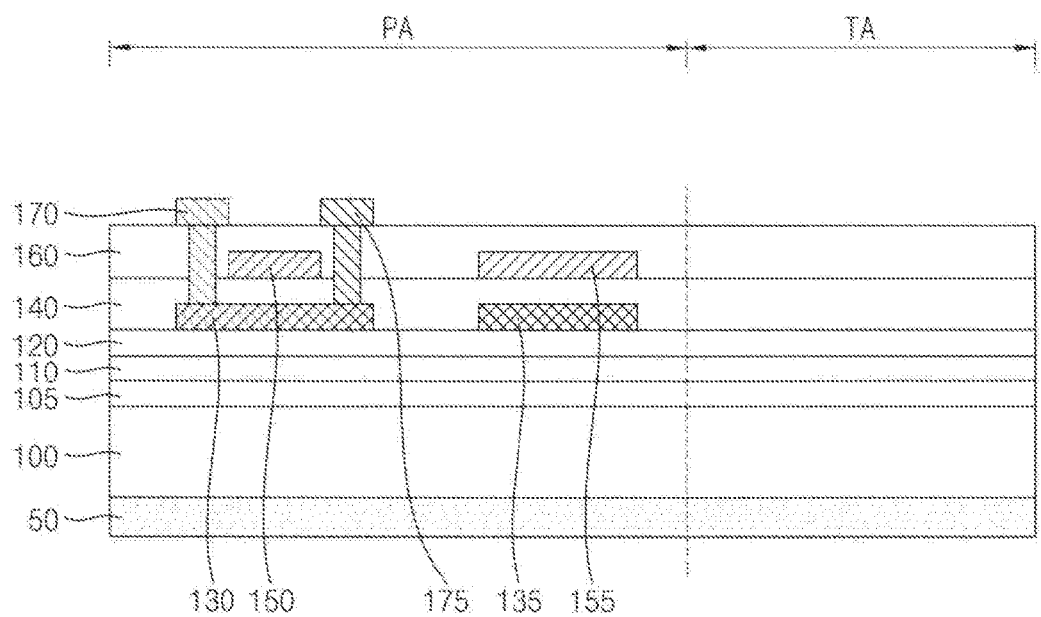

Referring to FIG. 6, additional insulation layers and a pixel circuit may be disposed on the buffer layer 120.

A first active pattern 130 and a second active pattern 135 may be disposed on the buffer layer 120. In this case, a semiconductor layer may be disposed on the buffer layer 120 using amorphous silicon or polysilicon, and then the semiconductor layer may be patterned to provide the first and the second active patterns 130 and 135 on the buffer layer 120.

In exemplary embodiments, a crystallization process such as a low temperature polycrystalline silicon ("LTPS") or a laser crystallization process may be performed about the semiconductor layer after the formation of the semiconductor layer. In an exemplary embodiment, the crystallization process may be carried out at a temperature between about 380° C. and about 500° C., for example.

When an insulation layer such as the barrier layer 110 is disposed on a chemically inactive transparent insulation substrate such as the base substrate 100, an adhesion strength between the transparent insulation substrate and the insulation layer may be relatively low. In this case, the insulation layer may be detached from the transparent insulation substrate in the crystallization process such as the LTPS process performed at a temperature of about 380° C. or more. According to exemplary embodiments, the adhesive layer 105 may be disposed on the base substrate 100, and then the barrier layer 100 may be disposed on the adhesive layer 105. Therefore, a detachment of the barrier layer 110 from the base substrate 100 may be prevented.

In exemplary embodiments, the semiconductor layer may be provided using oxide semiconductor such as IGZO, ZTO, ITZO, etc.

After a gate insulation layer 140 covering the first and the second active patterns 130 and 135 may be disposed on the buffer layer 120, and a first gate electrode 150 and a second gate electrode 155 may be disposed on the gate insulation layer 140. Here, after a first conductive layer may be disposed on the gate insulation layer 140, the first conductive layer may be etched by, e.g., a photolithography process to provide a first gate electrode 150 and a second gate electrode 155 on the gate insulation layer 140. The first gate electrode 150 and the second gate electrode 155 may substantially located on portions of the gate insulation layer 140 where the first active pattern 130 and the second active pattern 135 are positioned, respectively.

The first conductive layer may be provided using metal, alloy or metal nitride. In an exemplary embodiment, the first conductive layer may be provided by depositing a plurality of metal layers on the gate insulation layer 140, for example.

The first and the second gate electrodes 150 and 155 may be provided simultaneously with a scan line S (see FIG. 1). In an exemplary embodiment, the first and the second gate electrodes 150 and 155, and the scan line S may be provided by patterning the first conductive layer, for example. Here, the scan line S may be connected to the first gate electrode 150.

In exemplary embodiments, impurities may be implanted into the first active pattern 130 using the first gate electrode 150 as an implantation mask, such that a source region and a drain region may be disposed at both end portions of the first active pattern 130.

An insulating interlayer 160 may be disposed on the gate insulation layer 140 to substantially cover the first and the second gate electrodes 150 and 155. A source electrode 170 and a drain electrode 175 may be provided through the insulating interlayer 160 and the gate insulation layer 140 to contact the first active pattern 130. In an exemplary embodiment, the insulating interlayer 160 and the gate insulation layer 140 may be partially etched to provide contact holes through which the first active pattern 130 may be partially exposed. After a second conductive layer filling the contact holes may be disposed on the insulating interlayer 160, and the second conductive layer may be patterned by a photolithography process to provide the source electrode 170 and the drain electrode 175.

In exemplary embodiments, the source electrode 170 and the drain electrode 175 may contact the source region and the drain region, respectively. Further, the source electrode 170 may be connected to a data line D (see FIG. 1). In this case, the source electrode 170, the drain electrode 175 and the data line D may be provided by simultaneously patterning the second conductive layer in one etching process. In an exemplary embodiment, the second conductive layer may be provided using metal, alloy or metal nitride, for example.

Each of the gate insulation layer 140 and the insulating interlayer 160 may be provided using an inorganic material such as silicon oxide, silicon nitride or silicon oxynitride. In exemplary embodiments, the gate insulation layer 140 and/or the insulating interlayer 160 may be provided using a material by a process substantially the same as or similar to those for the barrier layer 110 and/or the buffer layer 120. In an exemplary embodiment, the gate insulation layer 140 and/or the insulating interlayer 160 may include silicon oxynitride only, for example.

As described above, a flow rate of the nitrogen source may be controlled so that relatively vertical concentration gradients of oxygen and nitrogen may be created in the gate insulation layer 140 and/or the insulating interlayer 160. When forming of the gate insulation layer 140, a silicon oxide precursor (or a silicon source and an oxygen source) and the nitrogen source may be introduced together in a process chamber, and then the flow rate of the nitrogen source may be gradually increased. Accordingly, a content of nitrogen in the gate insulation layer 140 may be gradually increased from an interface between the buffer layer 120 and the gate insulation layer 140 to a surface of the gate insulation layer 140. As a result, a lower portion of the gate insulation layer 140 may include a relatively oxygen-rich silicon oxynitride, and an upper portion of the gate insulation layer 140 may include a relatively nitrogen-rich silicon oxynitride.

In exemplary embodiments, $NH_3$ and $N_2O$ may be used together as the nitrogen source, and a flow rate ratio of $NH_3$ to $N_2O$ ($NH_3/N_2O$) may be controlled such that a refractive index of the gate insulation layer 140 and/or the insulating interlayer 160 may be adjusted. In an exemplary embodiment, the flow rate ratio of $NH_3$ to $N_2O$ may be controlled in a range of about 1 to about 5 or in a range of about 1.5 to about 3.0 so as to adjust the refractive index of the gate insulation layer 140 and/or the insulating interlayer 160 in a range of about 1.6 to about 1.8.

The gate insulation layer 140 and the insulating interlayer 160 may be disposed in the pixel area PA and the transmission area TA. The gate insulation layer 140 and the insulating interlayer 160 may be sequentially disposed on the buffer layer 120. Additionally, the first and the second conductive layers may be provided by a CVD process, a PECVD process, an HDP-CVD process, a thermal evaporation process, a sputtering process, an atomic layer deposition ("ALD") process and a printing process.

A TFT including the source electrode 170, the drain electrode 175, the first gate electrode 150, the gate insulation layer 140 and the first active pattern 130 may be provided in the pixel area PA. A capacitor including the second active pattern 135, the gate insulation layer 140 and the second gate electrode 155 may be also provided in the pixel area PA. Accordingly, the pixel circuit including the data line D, the scan line S, the TFT and the capacitor may be disposed in the pixel area PA.

Figure 7:
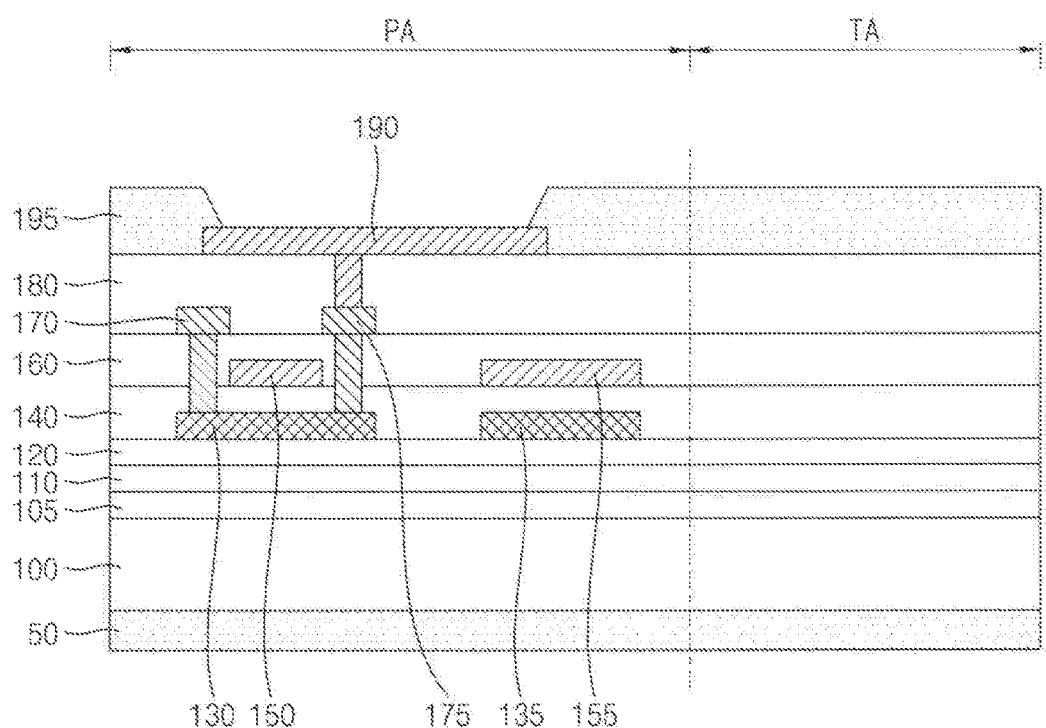

Referring to FIG. 7, a via insulation layer 180 may be disposed on the insulating interlayer 160 to substantially cover the source electrode 170 and the drain electrode 175. In an exemplary embodiment, the via insulation layer 180 may be provided using a transparent organic material such as polyimide, epoxy-based resin, acryl-based resin or polyester. The via insulation layer 180 may have a sufficient thickness and also may have a substantially flat or planar surface. In an exemplary embodiment, the via insulation layer 180 may be provided by a spin coating process or a printing process, for example.

A pixel electrode 190 may be disposed on the via insulation layer 180 to be electrically connected to the TFT. In an exemplary embodiment, the via insulation layer 180 may be partially etched to define a via hole through which the drain electrode 175 may be partially exposed. After a third conductive layer sufficiently filling the via hole may be disposed on the via insulation layer 180 and the exposed drain electrode 175, the third conductive layer may be patterned to provide the pixel electrode 190 the via insulation layer 180. The third conductive layer may be provided using a metal such as Al, Ag, W, Cu, Ni, Cr, Mo, Ti, Pt, Ta, Nd or Sc, or alloys of those metals by a thermal evaporation process, a vacuum deposition process, a sputtering process, an ALD process, a CVD process, a printing process, etc. In exemplary embodiments, the third conductive layer may be provided using a transparent conductive material such as ITO, IZO, zinc oxide, indium oxide, etc.

A PDL 195 may be disposed on the via insulation layer 180. The PDL 195 may substantially cover a peripheral portion of the pixel electrode 190 and the transmission area TA. A surface of the pixel electrode 190 may be partially exposed through the PDL 195. Here, a plurality of openings exposing portions of the pixel electrode 190 may be provided through the PDL 195. In an exemplary embodiment, a photosensitive organic material such as polyimide resin or acryl resin may be coated on the via insulation layer 180, and then the PDL 195 may be obtained exposure and developing processes, for example.

Figure 8:
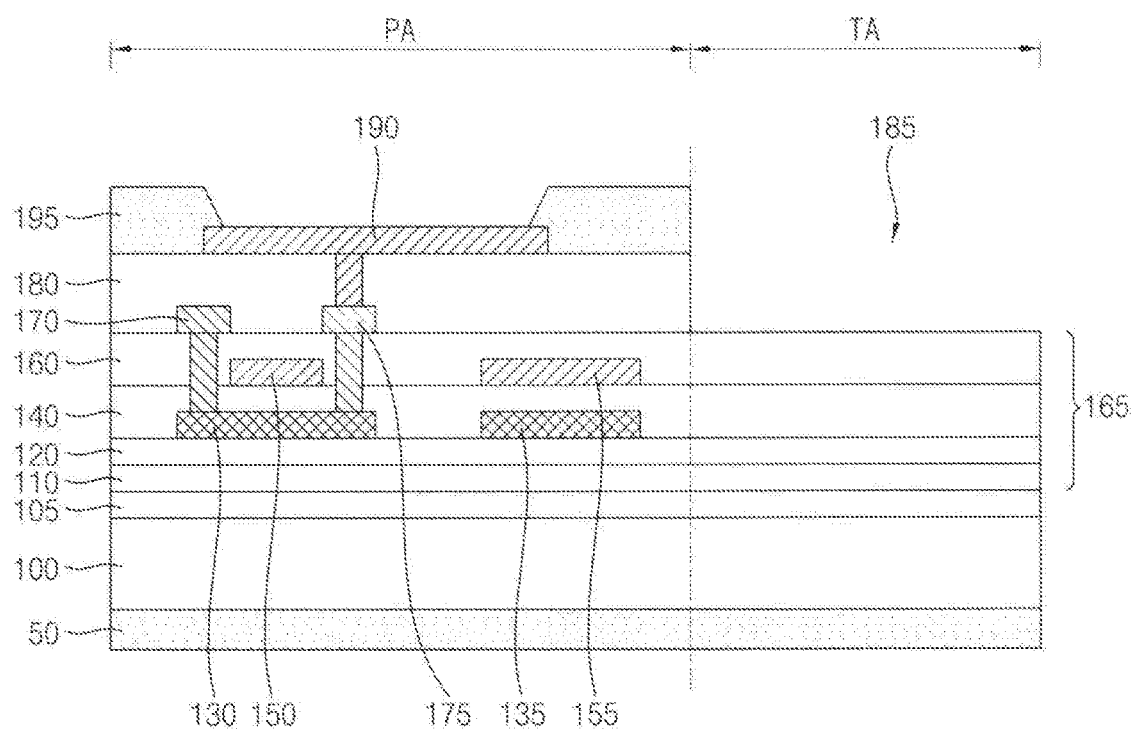

Referring to FIG. 8, portions of the PDL 195 and the via insulation layer 180 positioned in the transmission area TA may be partially removed to provide an transmitting window 185 and a transmitting structure 165 in the transmission area TA.

In exemplary embodiments, as illustrated in FIG. 8, portions of the PDL 195 and the via insulation layer 180 in the transmission area TA may be removed to provide the transmitting window 185. A surface of the insulating interlayer 160 may be exposed by the transmitting window 185. In this case, the transmitting window 185 may be defined by sidewalls of the PDL 195 and the via insulation layer 180, and the surface of the insulating interlayer 160.

The PDL 195 and the via insulation layer 180 may include substantially the same organic material. Thus, the PDL 195 and the via insulation layer 180 may be removed together by one etching process to relatively easily provide the transmitting window 185 in the transmission area TA.

The insulation layers positioned in the transmission area TA may belong to the transmitting structure 165. In exemplary embodiments, the transmitting structure 165 may include the barrier layer 110, the buffer layer 120, the gate insulation layer 140 and the insulating interlayer 160 sequentially disposed on the base substrate 100 in the transmission area TA.

In exemplary embodiments, each of the barrier layer 110, the buffer layer 120, the gate insulation layer 140 and the insulating interlayer 160 of the transmitting structure 165 may include a single composition substantially including silicon oxynitride only, for example. In this case, those layers of the transmitting structure 165 may be substantially integrally combined with one another, so that transmitting structure 165 may have the single-layered structure as illustrated in FIG. 3.

Figure 9:
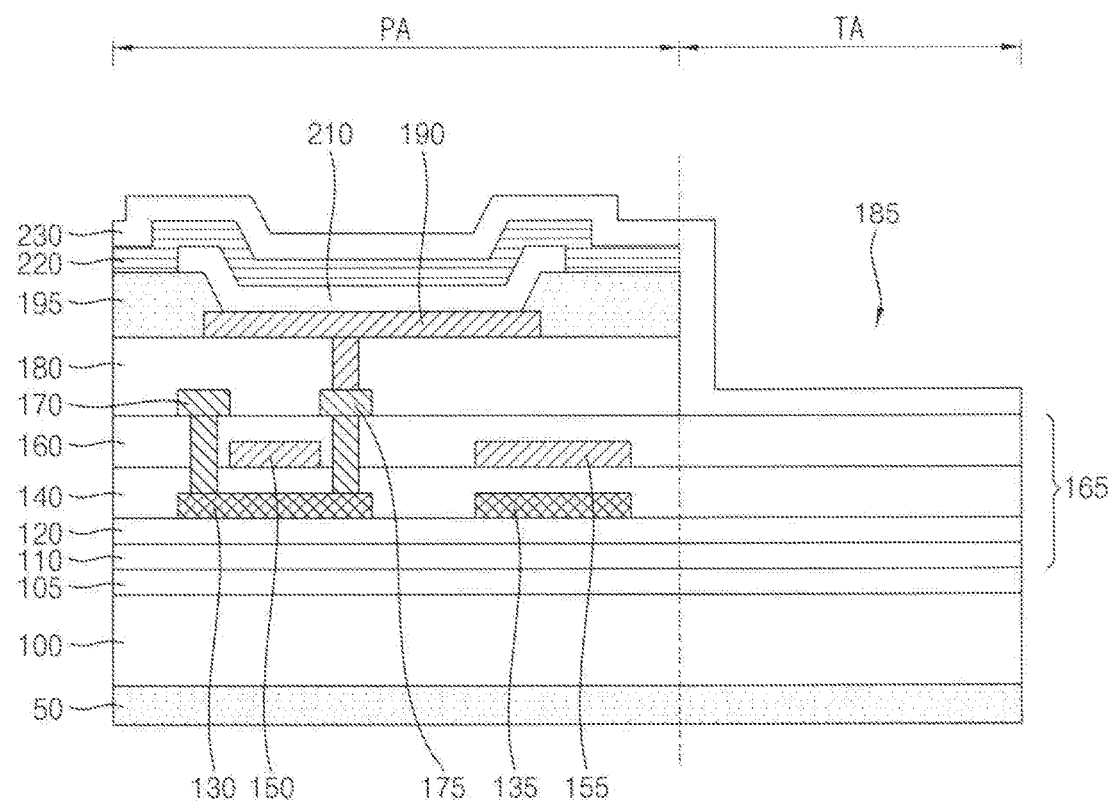

Referring to FIG. 9, a display layer 210 and an opposing electrode 220 may be selectively provided in the pixel area PA, and an encapsulation layer 230 may substantially cover the pixel area PA and the transmission area TA.

The display layer 210 may be provided using an organic light-emitting material for generating a red color of light, a green color of light or a blue color of light. In an exemplary embodiment, the display layer 210 may be provided by a spin coating process, a roll printing process, a nozzle printing process or an inkjet process using a fine metal mask ("FMM") that may include an opening through which a region corresponding to a red pixel, a green pixel, or a blue pixel is exposed. In exemplary embodiments, a plurality of display layers 210 for generating colors of light may be disposed in a plurality of pixels, respectively.

In exemplary embodiments, an HTL may be provided before the formation of the organic light-emitting layer using the above-mentioned hole transport material. An ETL may be also disposed on the organic light-emitting layer using the above-mentioned electron transport material. The HTL and the ETL may be disposed on surfaces of the PDL 195 and the pixel electrode 190, such that the HTL and the ETL may be shared by the plurality of pixels. In an alternative exemplary embodiment, the HTL or the ETL may be patterned for each of the pixels.

In an exemplary embodiment, a metal having a relatively low work function such as Al, Ag, W, Cu, Ni, Cr, Mo, Ti, Pt, Ta, Nd or Sc, or alloys of these metals may be deposited on the display layer 210 to provide the opposing electrode 220, for example. In an exemplary embodiment, a mask having openings exposing the plurality of the pixels may be used to deposit the metal by, e.g., a sputtering process for the formation of the opposing electrode 220.

The encapsulation layer 230 may be disposed on the opposing electrode 220. The encapsulation layer 230 may cover the opposing electrode 220 and may extend to the transmission area TA along a sidewall and a bottom of the transmitting window 185.

In an exemplary embodiment, the encapsulation layer 230 may be provided using an inorganic material such as silicon nitride, metal oxide, etc. In exemplary embodiments, the encapsulation layer 230 may be provided using silicon oxynitride substantially the same as or similar to that of the transmitting structure 165.

In exemplary embodiments, a capping layer (not illustrated) may be disposed on the opposing electrode 220 before the formation of the encapsulation layer 230 using an organic material such as polyimide resin, epoxy resin or acryl resin, or an inorganic material such as silicon oxide, silicon nitride or silicon oxynitride.

Figure 10:
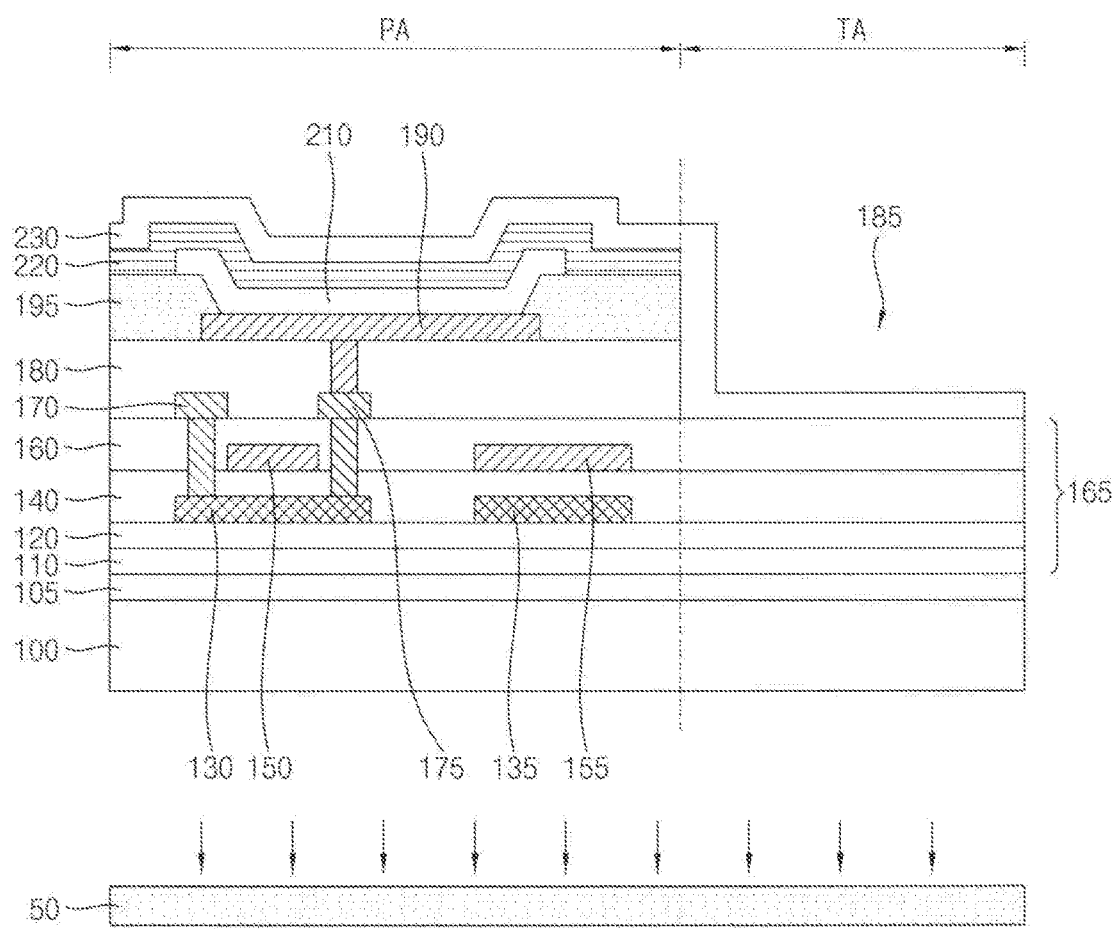

Referring to FIG. 10, the carrier substrate 50 may be separated from the base substrate 100. In an exemplary embodiment, a laser-lift process may be performed to separate the carrier substrate 50 from the base substrate 110, for example. In an alternative exemplary embodiment, a mechanical tension may be applied to detach the carrier substrate 50 without the laser-lift process, for example.

Figure 11:
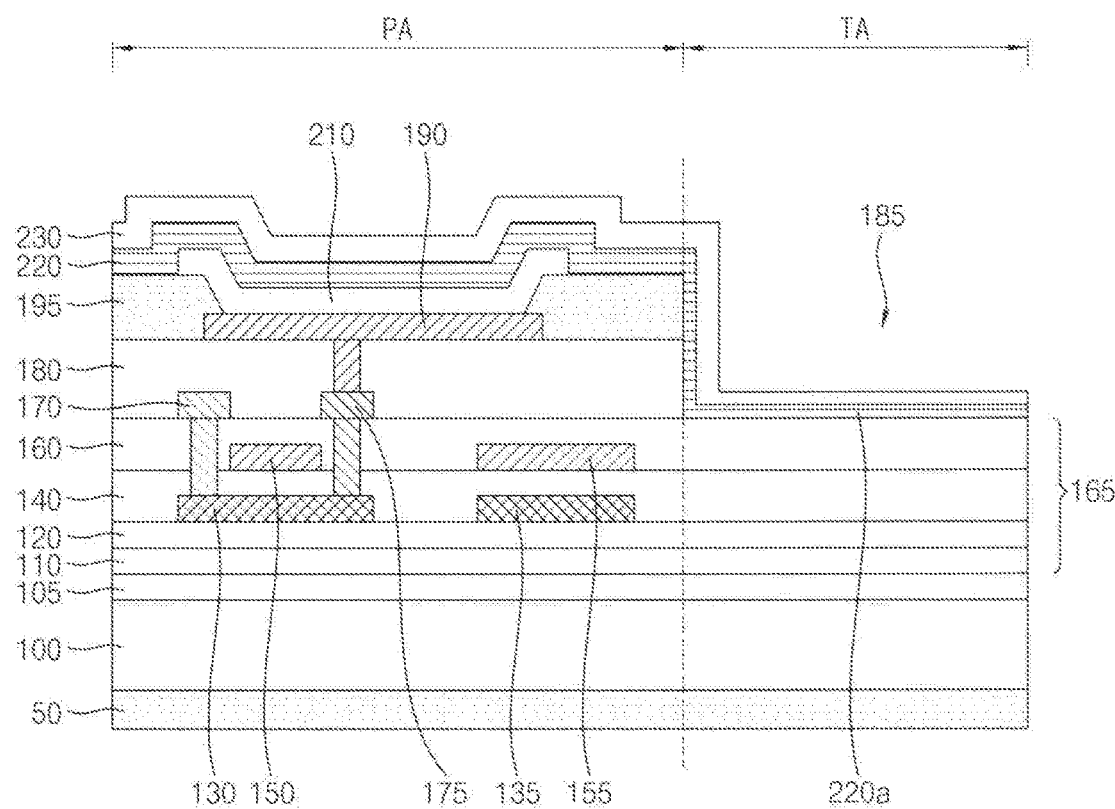

In exemplary embodiments, as illustrated in FIG. 11, the opposing electrode 220 may be provided continuously in the pixel area PA and the transmission area PA. In this case, the opposing electrode 220 may be provided by a depositing a metal using a mask that may expose the pixel area PA and the transmission area TA.

As illustrated in FIG. 11, a stepped portion may be created by the transmitting window 185 between the pixel area PA and the transmission area TA. Thus, a distance for depositing the metal may be increased in the transmission area TA, so that a portion 220a of the opposing electrode 220 may have a relatively small thickness in the transmission area TA. Accordingly, the portion 220a of the opposing electrode 220 in the transmission area TA may be provided as a thin layer, and a reduction of transmittance in the transmission area TA may be prevented.

Then, the carrier substrate 50 may be separated from the base substrate 100 as illustrated in FIG. 10, such that the transparent display device according to exemplary embodiments may be obtained.

The transparent display devices according to exemplary embodiments may be applied to flexible display devices with an improved transmittance. In an exemplary embodiment, the transparent display devices may be applied to various electronic devices such as computers, cellular phones, smart phones, smart pads, or MP3 players as well as navigators for automobiles or head-up displays.

Although a few exemplary embodiments have been described, those skilled in the art will readily appreciate that many modifications are possible in the exemplary embodiments without materially departing from the novel teachings and advantages of the invention.

What is claimed is:

1. A transparent display device comprising:
a base substrate including a pixel area and a transmission area;
a barrier layer disposed on the base substrate;
a pixel circuit disposed on the base substrate in the pixel area;
a display structure disposed on the pixel circuit;
a transmitting structure disposed on the base substrate in the transmission area, the transmitting structure including a composition including silicon oxynitride;
an adhesive layer disposed between the base substrate and the barrier layer, and between the base substrate and the transmitting structure, the adhesive layer including aluminum oxide; and
a transmitting window exposing the transmitting structure in the transmission area,
wherein the pixel area has a transmitting property and the transmission area has a transparent property defining the transparent display device.

2. The transparent display device of claim 1, wherein a refractive index of the adhesive layer is in a range of about 1.6 to about 1.8.

3. The transparent display device of claim 1, wherein a thickness of the adhesive layer is in a range of about 5 nanometers to about 30 nanometers.

4. The transparent display device of claim 1, wherein the adhesive layer has a compressive stress therein.

5. The transparent display device of claim 1, wherein the pixel circuit includes an active pattern, a gate electrode, a source electrode and a drain electrode, and
wherein the transparent display device further comprises:
a gate insulation layer disposed on the barrier layer to cover the active pattern;
an insulating interlayer which is disposed on the gate insulation layer and covers the gate electrode; and
a via insulation layer which is disposed on the insulating interlayer, covers the source electrode and the drain electrode, the source electrode and the drain electrode extending through the insulating interlayer and the gate insulation layer and contacting the active pattern.

6. The transparent display device of claim 5, wherein each of the barrier layer, the gate insulation layer and the insulating interlayer includes silicon oxynitride.

7. The transparent display device of claim 6, wherein each of the barrier layer, the gate insulation layer and the insulating interlayer extends from the pixel area to the transmission area, and the transmitting structure includes portions of the barrier layer, the gate insulation layer and the insulating interlayer extended to the transmission area.

8. The transparent display device of claim 7, wherein layers of the transmitting structure are integrally combined with one another and together have a single-layered structure.

9. The transparent display device of claim 5, further comprising a buffer layer disposed between the barrier layer and the gate insulation layer.

10. The transparent display device of claim 9, wherein each of the barrier layer, the buffer layer, the gate insulation layer and the insulating interlayer includes silicon oxynitride.

11. The transparent display device of claim 10, wherein each of the barrier layer, the buffer layer, the gate insulation layer and the insulating interlayer extends from the pixel area to the transmission area, and the transmitting structure includes portions of the barrier layer, the buffer layer, the gate insulation layer and the insulating interlayer extended to the transmission area.

12. The transparent display device of claim 11, wherein layers of the transmitting structure are integrally combined with one another and together have a single-layered structure.

13. The transparent display device of claim 5, wherein the via insulation layer is selectively disposed in the pixel area and does not extend to the transmission area.

14. The transparent display device of claim 5, wherein the display structure includes:
a pixel electrode disposed on the via insulation layer, the pixel electrode extending through the via insulation layer and contacting the drain electrode;
a display layer disposed on the pixel electrode; and an opposing electrode disposed on the display layer and facing the pixel electrode, wherein the transparent display device further comprises a pixel defining layer partially covering the pixel electrode on the via insulation layer.

15. The transparent display device of claim 14, wherein the pixel defining layer is selectively disposed in the pixel area and does not extend to the transmission area.

16. The transparent display device of claim 15, wherein the opposing electrode is disposed along surfaces of the pixel defining layer and the display layer, and a sidewall and a bottom face of the transmitting window, and wherein a thickness of a portion of the opposing electrode on the sidewall and the bottom face of the transmitting window is smaller than a thickness of a portion of the opposing electrode on the surfaces of the pixel defining layer and the display layer.

17. The transparent display device of claim 14, wherein the opposing electrode is selectively disposed in the pixel area and does not extend to the transmission area.

18. A method of manufacturing a transparent display device, the method comprising:

providing a base substrate including a pixel area and a transmission area;

forming an adhesive layer on the base substrate using aluminum oxide;

forming a barrier layer on the adhesive layer using silicon oxynitride;

forming a pixel circuit on the barrier layer;

forming an insulation layer covering the pixel circuit on the barrier layer; and forming a display structure on the insulation layer, wherein the pixel area has a transmitting property and the transmission area has a transparent property defining the transparent display device.

19. The method of claim 18, wherein the adhesive layer has a compressive stress therein.

20. The method of claim 18, wherein the forming the pixel circuit includes:

forming a semiconductor layer on the barrier layer; and performing a crystallization process on the semiconductor layer, wherein the crystallization process is performed at a temperature in a range of about 380 degrees Celsius to about 500 degrees Celsius.

* * * * *